United States Patent
Itoh et al.

(10) Patent No.: US 7,251,761 B2
(45) Date of Patent: Jul. 31, 2007

(54) ASSEMBLY FOR LSI TEST AND METHOD FOR THE TEST

(75) Inventors: Wataru Itoh, Kyoto (JP); Tomohiko Kanemitsu, Osaka (JP); Takeru Yamashita, Osaka (JP); Akihiko Watanabe, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 427 days.

(21) Appl. No.: 10/637,663

(22) Filed: Aug. 11, 2003

(65) Prior Publication Data

US 2004/0160237 A1 Aug. 19, 2004

(30) Foreign Application Priority Data

Feb. 13, 2003 (JP) ............................. 2003-034858

(51) Int. Cl.
  *G01R 31/28* (2006.01)
(52) U.S. Cl. .................................................. 714/724
(58) Field of Classification Search ...................... None
  See application file for complete search history.

(56) References Cited

U.S. PATENT DOCUMENTS

| | | | |
|---|---|---|---|
| 3,733,587 A * | 5/1973 | Lloyd et al. ................. 714/25 |
| 4,710,930 A | 12/1987 | Hatayama et al. |
| 4,760,335 A | 7/1988 | Lindberg |
| 4,912,395 A | 3/1990 | Sato et al. |
| 5,416,784 A * | 5/1995 | Johnson ..................... 714/733 |
| 6,324,485 B1 * | 11/2001 | Ellis ........................... 702/117 |
| 6,421,789 B1 * | 7/2002 | Ooishi ............................ 714/7 |
| 6,665,816 B1 * | 12/2003 | Edwards et al. ............. 714/30 |
| 2001/0054166 A1 * | 12/2001 | Fukuda ....................... 714/733 |
| 2002/0091978 A1 * | 7/2002 | Higashida ................... 714/726 |
| 2002/0099992 A1 * | 7/2002 | Distler et al. ............... 714/738 |
| 2002/0194564 A1 * | 12/2002 | Tsuji et al. .................. 714/727 |
| 2004/0160237 A1 * | 8/2004 | Itoh et al. ................... 324/765 |

FOREIGN PATENT DOCUMENTS

JP 63-315971 12/1988

(Continued)

OTHER PUBLICATIONS

Hermann A L: "Diagnostic Data Comparator" IBM Technical Disclose Bulletin, IBM Corp. New York, US, vol. 24, No. 5, Oct. 1, 1981, pp. 2591-2592, XP000713903, ISSN: 0018-8689 *the whole document*.

(Continued)

*Primary Examiner*—Cynthia Britt
*Assistant Examiner*—Steven D. Radosevich
(74) *Attorney, Agent, or Firm*—McDermott Will & Emery LLP

(57) ABSTRACT

An assembly for an LSI test supplies a test signal output from an LSI tester to a target LSI to be tested and outputs, to the LSI tester, a test result signal generated by processing of the target LSI performed in accordance with the test signal. The assembly for an LSI test includes: a peripheral circuit coupled to the target LSI and allowing the target LSI to operate in the same manner as in the application environment; and a printed circuit board on which the peripheral circuit is mounted.

13 Claims, 10 Drawing Sheets

FOREIGN PATENT DOCUMENTS

| | | | |
|---|---|---|---|
| JP | 2-285215 | | 11/1990 |
| JP | 4-155278 | * | 5/1992 |
| JP | 04155278 | | 5/1992 |
| JP | 07-128405 | | 5/1995 |
| JP | 7-128405 | * | 5/1995 |
| JP | 10-339769 | | 12/1998 |
| JP | 2000-506985 | | 6/2000 |
| JP | 2002-340991 | * | 11/2002 |
| JP | 2002-340991 A | | 11/2002 |
| WO | WO 98/26301 | | 6/1998 |
| WO | WO 02/29824 | * | 4/2002 |

OTHER PUBLICATIONS

Tomoyuki Hamasuna, "Major Problems and Solutions of the System LSI Testing", SEMI Technology Symposium 2001, Semiconductor Equipment and Materials International, Dec. 5-7, 2001.

Chinese Office Action issued in corresponding Chinese Patent Application No. CN 03127857.4, dated Sep. 22, 2006.

* cited by examiner

ASSEMBLY FOR LSI TEST AND METHOD FOR THE TEST

BACKGROUND OF THE INVENTION

The present invention relates to methods and apparatus for testing large-scale integration (LSI).

LSI tests using LSI testers have been conducted in order to select LSIs that operate normally. The LSI testers test target LSIs independently of other components or in combination with simple components that support the test. The simple components are herein passive elements such as relays, resistors, capacitors and filters.

FIG. 10 is a block diagram showing an example of a configuration of a known LSI test system. The LSI test system shown in FIG. 10 includes an LSI tester 2 and a load board 900. The load board 900 includes a socket 14, a relay 82, a capacitor 84, a filter 86, a resistor 88 and a printed circuit board 940.

A target LSI 912 is inserted into the socket 14 and coupled to the LSI tester 2 via the load board 900 so as to be tested. The relay 82 switches the connection between the target LSI 912 and the LSI tester 2. The capacitor 84, filter 86 and resistor 88 are used for changing the characteristics of signals and stabilizing power supply during the test.

The LSI tester 2 tests the actual operation of the target LSI 921 using such a load board 900. Specifically, the LSI tester 2 supplies a predetermined test signal TS0 to the target LSI 912. The target LSI 912 outputs a test result signal TR0 in response to the test signal TS0. Based on the test result signal TR0, the LSI tester 2 determines whether or not the target LSI 912 is defective.

If the target LSI 912 includes an output interface, which operates asynchronously to the main portion of the target LSI 912, and the output interface is to be tested, the output interface is operated independently and is tested.

A technique relating to the present invention is disclosed in Japanese Laid-Open Publication No. 7-128405, for example.

A general LSI tester, however, cannot perform a functional test on a target LSI by simultaneously supplying a given signal and a signal having a frequency which is not an integral multiple of the given signal to the target LSI. Therefore, the load board 900 can easily perform a functional test on a simple LSI in the actual operation but has a difficulty in performing the test on a system LSI (system-on-a-chip) having features of high speed, asynchronous and multiple clocks, in the actual operation. The functional test on a system LSI in the actual operation requires not a general LSI tester but a high-speed and high-performance LSI tester, thus arising a problem of increased cost for the test.

Similar problems are also pointed out in "Major Problems and Solutions of the System LSI Testing" by Tomoyuki Hamasuna in SEMI (semiconductor equipment and materials international) technology symposium 2001 proceedings, pp. 5-81 to 5-88.

Specifically, a test predicated on a SCAN test is effective as a structural test having a purpose of detecting manufacturing defects. However, when the functional circuit structure of the LSI itself becomes complicated, the number of critical paths increases in the actual operation. The SCAN test is not effective for detection of such critical paths.

As well known in the art, a structural test such as the SCAN test and a functional test in the actual operation often have different results of failure detection. The functional test in the actual operation is necessary, but it requires a high-speed and high-functional LSI tester as described above, thus resulting in increased cost for the test.

SUMMARY OF THE INVENTION

It is therefore an object of the present invention to provide an assembly for performing a functional test on an LSI in the actual operation at low cost and a method for the test.

Specifically, an inventive assembly for an LSI test, which supplies a test signal output from an LSI tester to a target LSI to be tested and outputs, to the LSI tester, a test result signal generated by processing of the target LSI performed in accordance with the test signal, includes: a peripheral circuit coupled to the target LSI and allowing the target LSI to operate in the same manner as in the application environment; and a printed circuit board on which the peripheral circuit is mounted.

With this unit, it is sufficient for the LSI tester to output simple control signals such as a synchronizing signal and a reset signal as well as test data, as test signals. Accordingly, it is possible to test the function of an LSI in the actual operation using a general LSI tester which does not operate at high speed and is not provided with high functionality. As a result, the cost of the test can be reduced and the quality of the test can be improved.

DESCRIPTION OF THE PREFERRED EMBODIMENTS

Hereinafter, embodiments of the present invention will be described with reference to the drawings.

Embodiment 1

Figure 1:
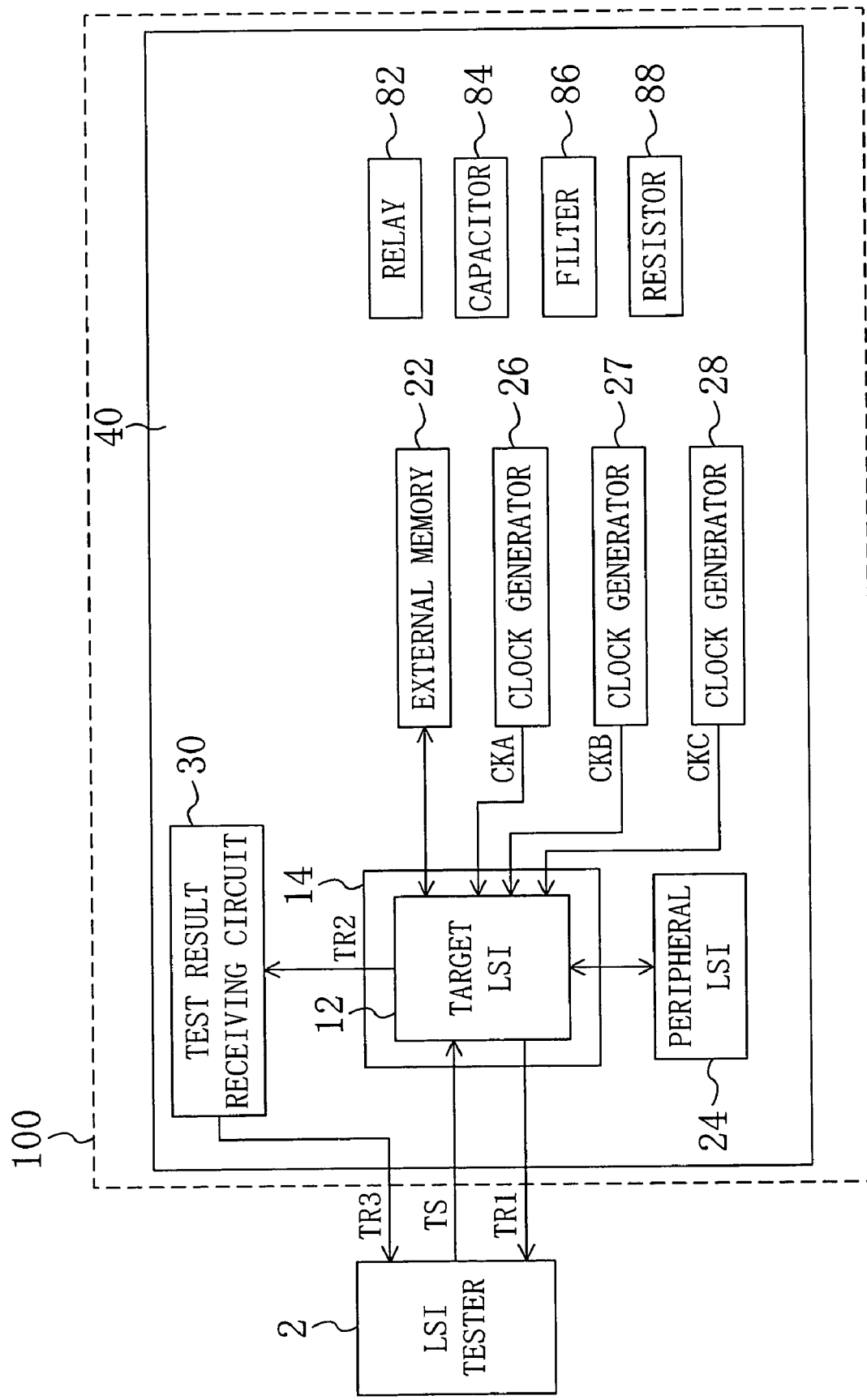
FIG. 1 is a block diagram showing an example of a configuration of an LSI test system according to a first embodiment of the present invention.

FIG. 1 is a block diagram showing an example of a configuration of an LSI test system according to a first embodiment of the present invention. The LSI test system shown in FIG. 1 includes: an LSI tester 2; and a load board 100 as an assembly for an LSI test. The load board 100 includes: a socket 14; an external memory 22; a peripheral LSI 24; clock generators 26, 27 and 28; and a test result receiving circuit 30. The load board 100 further includes: a relay 82; a capacitor 84; a filter 86; and a resistor 88, which are passive circuits.

The load board 100 includes a printed circuit board 40 provided with necessary wiring on which the components described above are mounted. The external memory 22 and the peripheral LSI 24 together constitute a peripheral circuit for a target LSI 12 to be tested.

The target LSI 12 is inserted into the socket 14 and connected to the other circuits via the socket 14 so that the functional test is performed on the target LSI 12 in the actual operation. The circuits and other components on the load board 100 except for the target LSI 12 are assumed to have been confirmed to operate normally.

The external memory 22 and the peripheral LSI 24 are used to allow the target LSI 12 to operate in the same manner as when the target LSI 12 is actually used by a user (i.e., in the application environment). The external memory 22 and the peripheral LSI 24 are configured as a device which is to be coupled to the target LSI 12 and used in the application environment of the target LSI 12. The external memory 22 stores data output from the target LSI 12 and outputs the stored data to the target LSI 12. The peripheral LSI 24 inputs/outputs data to/from the target LSI 21 in the same manner as in the application environment.

The clock generators 26, 27 and 28 generate clocks CKA, CKB and CKC, respectively, and supply the clocks to the target LSI 12. The target LSI 12 supplies the clocks CKA, CKB and CKC to the external memory 22, the peripheral LSI 24 and the test result receiving circuit 30.

The clock CKA is a reference clock used for data processing in the target LSI 12, the external memory 22 and the peripheral LSI 24. The clock CKB is a clock used by the target LSI 12 to receive a test signal. The clock CKC is a clock used by the target LSI 12 to output a test result signal.

The relay 82, the capacitor 84, the filter 86 and the resistor 88 are coupled to the foregoing circuits as required. The LSI tester 2 supplies electric power to the target LSI 12, the external memory 22, the peripheral LSI 24, the clock generators 26 through 28 and the test result receiving circuit 30.

On the printed circuit board 40 of the load board 100, wiring for allowing the target LSI 12 to operate in the same manner as in the application environment as described above and, in addition, wiring for coupling the LSI tester 2 and the target LSI 12 to each other are provided. The LSI tester 2 supplies the target LSI 12 with a test signal TS for conducting a functional test via the latter wiring. Then, the target LSI 12 generates a test result signal TR1 through processing performed according to the test signal TS, and outputs the test result signal TR1 to the LSI tester 2.

The target LSI 12 is also capable of outputting the test result signal TR2 to the test result receiving circuit 30. The test result receiving circuit 30 performs given processing on data obtained as the test result signal TR2 output from the target LSI 12 so as to reduce the amount of the data, and outputs a result of the given processing as a test result signal TR3 to the LSI tester 2.

The configuration of the load board 100 shown in FIG. 1 is an example and it is sufficient for the target LSI 12 to be coupled to other circuits and the like provided on the load board, as in the application environment.

Figure 2:
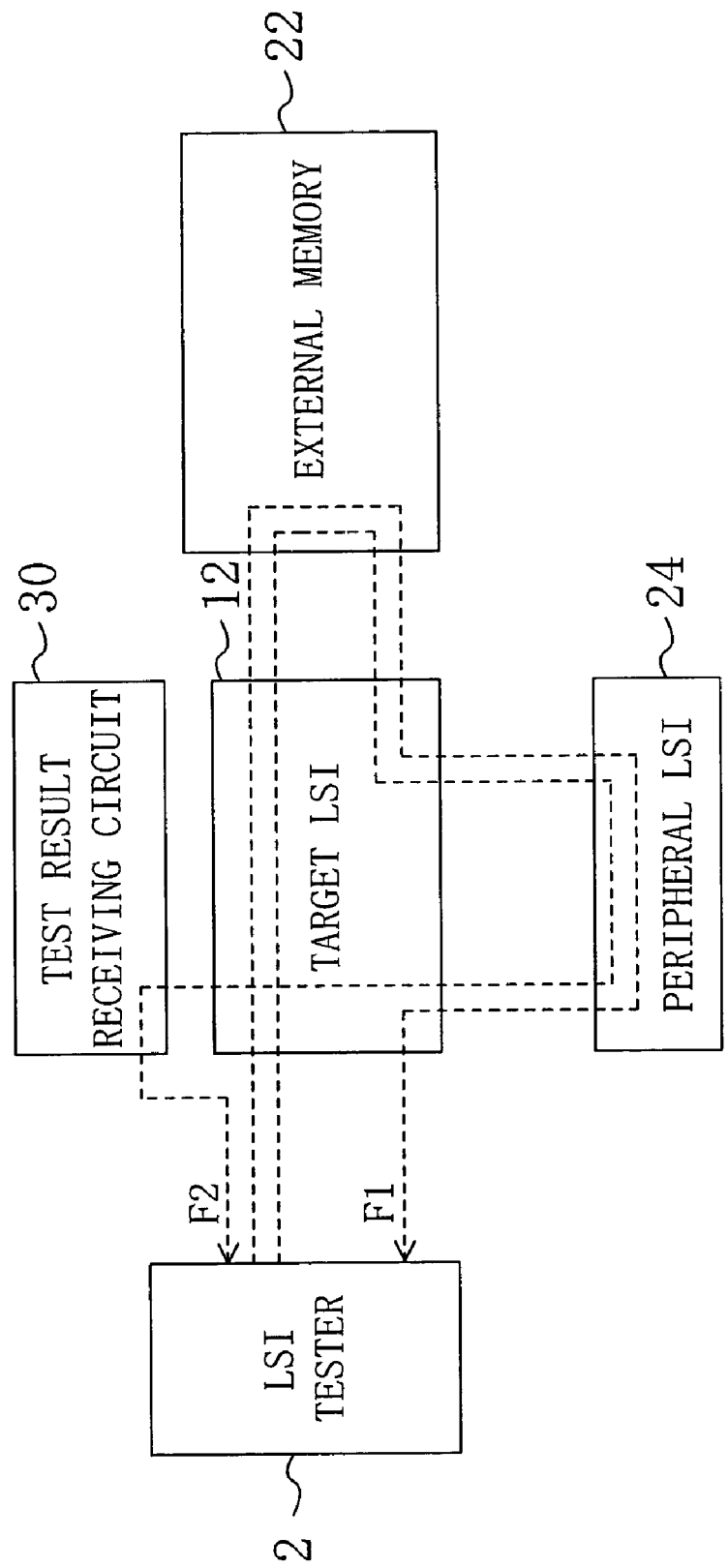
FIG. 2 is a diagram showing the flow of data in a test according to the first embodiment.

FIG. 2 is a diagram showing the flow of data in a test according to the first embodiment. A data flow F1 shown in FIG. 2 will be described with reference to FIG. 1. First, the test signal TS output from the LSI tester 2 is supplied to the external memory 22 by way of the target LSI 12 and stored in the memory 22.

Next, in the same manner as in the application environment, the target LSI 12 receives the stored test signal from the external memory 22 and processes the test signal, while inputting/outputting data to/from the external memory 22 and the peripheral LSI 24. Then, the target LSI 12 outputs the test result signal TR1 obtained through the processing to the LSI tester 2. The LSI tester 2 stores a reference test result signal that should be equal to the test result signal TR1 when the target LSI 12 operates normally. The LSI tester 2 compares the test result signal TR1 with the stored reference test result signal so as to determine whether or not the target LSI 12 is defective.

If the target LSI 12 includes an output interface circuit and the output interface circuit is to be tested, the flow of data as indicated by a data flow F2 in FIG. 2 is adopted. Specifically, the target LSI 12 processes the test signal in the same manner as in the case of the data flow F1, and then outputs the result, as the test result signal TR2, to the test result receiving circuit 30 via the output interface circuit. The test result receiving circuit 30 processes the test result signal TR2 and outputs the result to the LSI tester 2 as the test result signal TR3.

Though FIG. 2 show the data flows F1 and F2 in a simplified manner, input/output of data between the target LSI 12 and the external memory 22 and between the target LSI 12 and the peripheral LSI 24 is performed a plurality of times during the processing.

Figure 3:
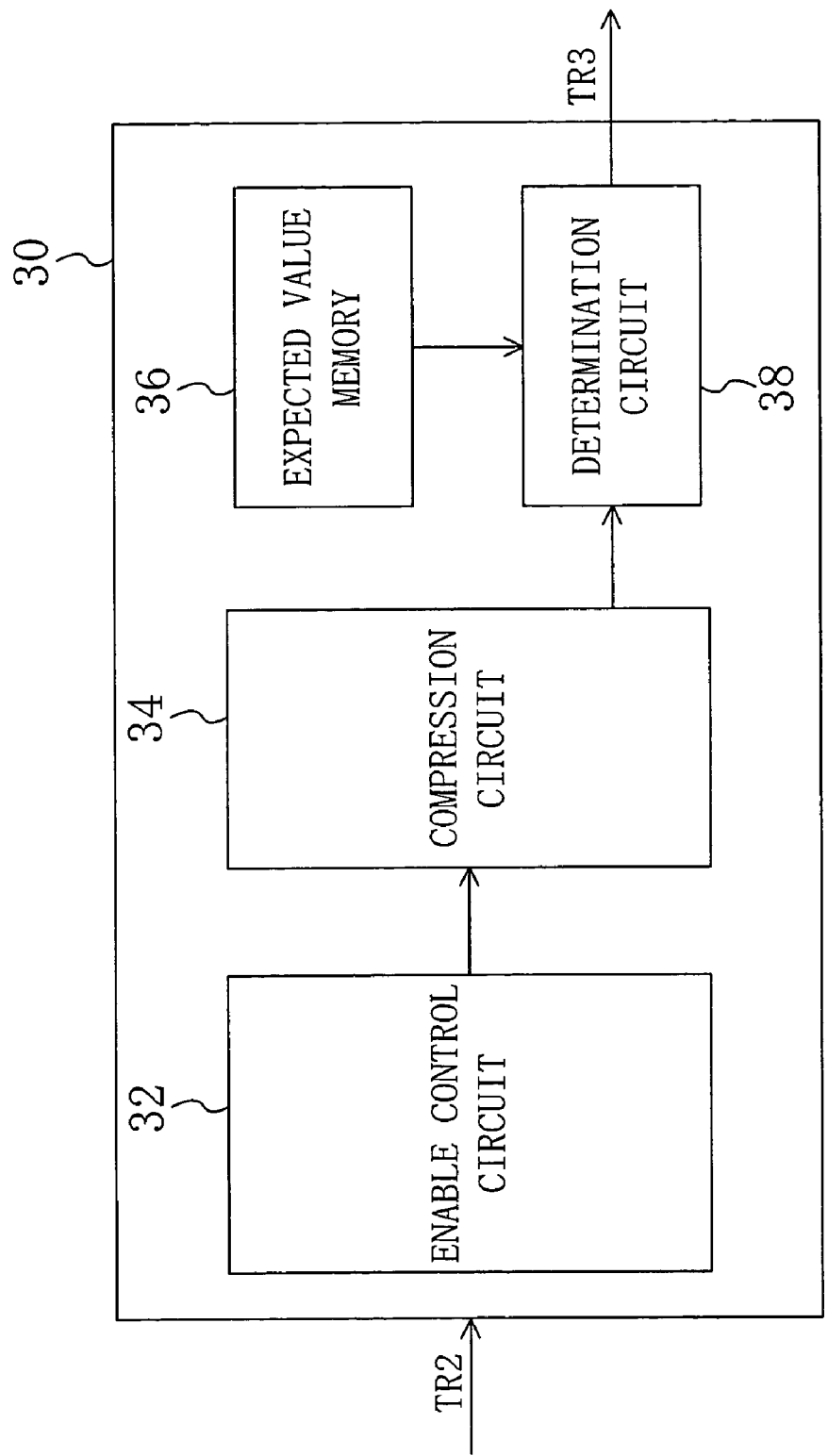
FIG. 3 is a block diagram showing an example of a configuration of a test result receiving circuit shown in FIG. 1.

Now, the test result receiving circuit 30 will be described. FIG. 3 is a block diagram showing an example of a configuration of the test result receiving circuit 30 shown in FIG. 1. The test result receiving circuit 30 includes: an enable control circuit 32; a compression circuit 34; an expected value memory 36; and a determination circuit 38.

The enable control circuit 32 receives the test result signal TR2 from the target LSI 12. The enable control circuit 32 selects, from data received as the test result signal TR2, data necessary for determining whether or not the target LSI 12 is defective, and then outputs the selected data to the compression circuit 34. For example, the enable control circuit 32 selects, from data representing a video signal (including a synchronizing signal) received as the test result signal TR2, data representing part of the video signal except for the synchronizing signal and outputs the selected data.

The compression circuit 34 compresses the received data and outputs the compressed data to the determination circuit 38. In this embodiment, "compression" means logical operation on, for example, the received bits so as to obtain a fewer number of bits as a result.

The expected value memory 36 stores data that should be obtained by the compression circuit 34 when the target LSI 12 operates normally, and the expected value memory 36 outputs the data to the determination circuit 38 if necessary. The determination circuit 38 makes a comparison between the output from the compression circuit 34 and the output from the expected value memory 36 to determine whether or not these outputs coincide with each other, and outputs the result of the determination to the LSI tester 2 as the test result signal TR3. That is to say, the test result receiving circuit 30 determines whether or not the target LSI 12 is defective.

In the test result receiving circuit 30, the determination is not necessary and the output from the enable control circuit 32 or the compression circuit 34 may be output to the LSI tester 2 as a test result signal, instead. In such a case, the LSI tester 2 compares the value obtained as the test result signal with a value that should be obtained, thereby determining whether or not the target LSI 12 is defective. Alternatively, the target LSI may include an enable control circuit.

Figure 4:
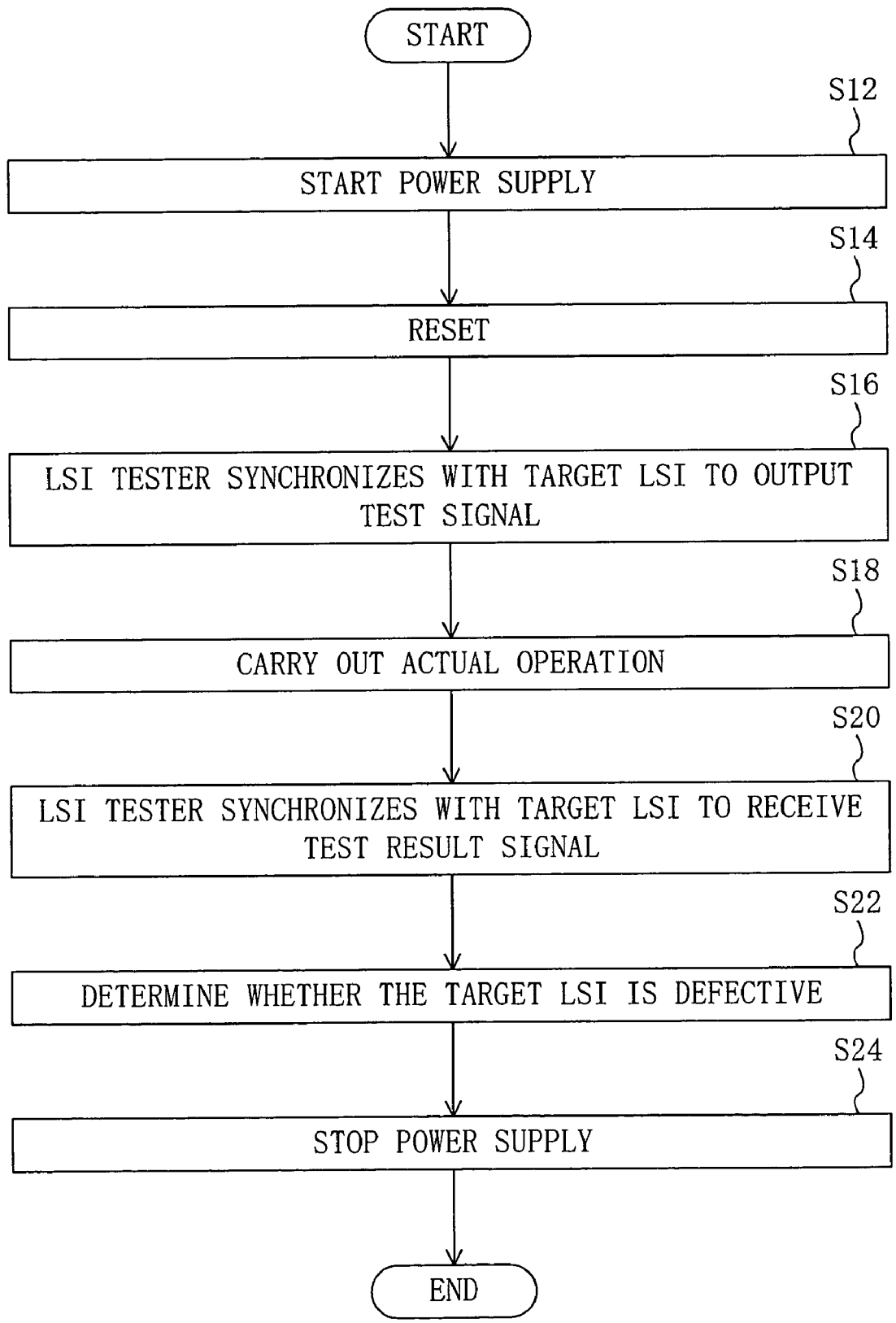
FIG. 4 is a flowchart showing a procedure of the test according to the first embodiment.

FIG. 4 is a flowchart showing a procedure of a test according to the first embodiment. The procedure for the test in the LSI test system shown in FIG. 1 will be described with reference to FIG. 4. In step S12 in FIG. 4, the LSI tester 2 starts the supply of electric power to target LSI 12, the external memory 22, the peripheral LSI 24, the clock generators 26 through 28, and the test result receiving circuit 30. Then, the clocks CKA, CKB and CKC are supplied from the clock generators 26, 27 and 28, respectively, to the target LSI 12.

In step S14, the LSI tester 2 resets the target LSI 12, asynchronously to the clocks CKA, CKB and CKC. Then, the target LSI 12 can operate in the same manner as in the application environment.

Since the input circuit of the target LSI 12 operates in accordance with the clock CKB, the LSI tester 2 needs to synchronize with the clock CKB in order to supply the test signal TS to the target LSI 12. Therefore, the procedure proceeds to subsequent step S16.

In step S16, the LSI tester 2 adjusts the timing of outputting the test signal TS to synchronize with operation of the input circuit of the target LSI 12 using the clock CKB, and then starts outputting the test signal TS to the target LSI 12. At this time, the LSI tester 2 uses an edge-searching function or a matching function. These functions are functions that are incorporated into general LSI testers.

In step S18, circuits on the load board 100 operate in the same manner as in the application environment in synchronization with the clock CKA. However, the input circuit of the target LSI 12 and the LSI tester 2 operate in synchronization with the clock CKB. That is to say, the circuits on the load board 100 except for the input circuit of the target LSI 12 operate asynchronously to the LSI tester 2.

The output circuit of the target LSI 12 operates in accordance with the clock CKC. Accordingly, in order that the LSI tester 2 receives the test result signal TR1 from the target LSI 12, the LSI tester 2 needs to synchronize with the clock CKC. Therefore, the procedure proceeds to subsequent step S20.

In step S20, the LSI tester 2 adjusts the timing of receiving the test result signal TS1 to synchronize with operation of the output circuit of the target LSI 12 using the clock CKC, and then receives the test result signal TS1 from the target LSI 12.

In step S22, the LSI tester 2 compares the obtained test result signal TR1 with the reference test result signal that should be obtained, thereby determining whether or not the target LSI 12 is defective.

Then, in step S24, the LSI tester 2 stops the supply of electric power, and the procedure ends.

If the target LSI 12 includes an output interface circuit and the output interface circuit is to be tested, the test result receiving circuit 30 receives the test result signal TR2 in step S20, processes the received signal in step S22, and then outputs the result of the process to the LSI tester 2.

In this manner, according to this embodiment, it is possible to test a system LSI having features such as asynchronous operation between input/output of data and internal operation, multiple clocks, and high-speed input/output interface, while operating the system LSI in the same manner as in the application environment, using a general LSI tester which does not operate at high speed and does not have an especially high functionality. Accordingly, the cost for the test is reduced and the quality of the test is greatly improved.

Even with extremely high-speed interfaces between the target LSI 12 and the external memory 22 and between the target LSI 12 and the peripheral LSI 24, the operation can be tested in the same manner. This is because these interfaces are independent of input/output to/from the LSI tester 2, so that the LSI tester 2 does not need to operate at high speed.

In this embodiment, the target LSI 12 inputs/outputs data to/from the LSI tester 2 with the LSI tester 2 in synchronization with the clocks CKB and CKC. However, this process may be omitted, if not necessary.

Embodiment 2

In a second embodiment of the present invention, a load board which is easily implemented and is fabricated at reduced cost will be described.

The load board of the first embodiment is equivalent to a board that uses the target LSI for a set to be actually used by a user with wiring for an LSI test provided on the board. The board for a set actually used by a user or an evaluation board for use in evaluation by the user differ from the load board for use in the LSI test by a LSI vendor in the number of wiring layers and wiring length, so that these boards are fabricated individually in general.

The fabrications of the respective boards require mutually different techniques and different types of know-how. Accordingly, if the board used by the user and the board used by the LSI vendor are to be combined into one board, these techniques and types of know-how need to be combined, and a highly developed technique is required. However, the user and the LSI vendor are separate companies in most cases, and therefore the user hardly makes their technique for board fabrication available to the LSI vendor. As a result, it is extremely difficult to combine both techniques of the user and the LSI vendor.

If the board includes a lager number of layers, it is more technically difficult to fabricate the board, and the cost thereof soars. A load board generally uses a multilayer board. However, the load board of the first embodiment uses a board including larger numbers of layers, so that it costs a lot to fabricate the board.

Figure 5:
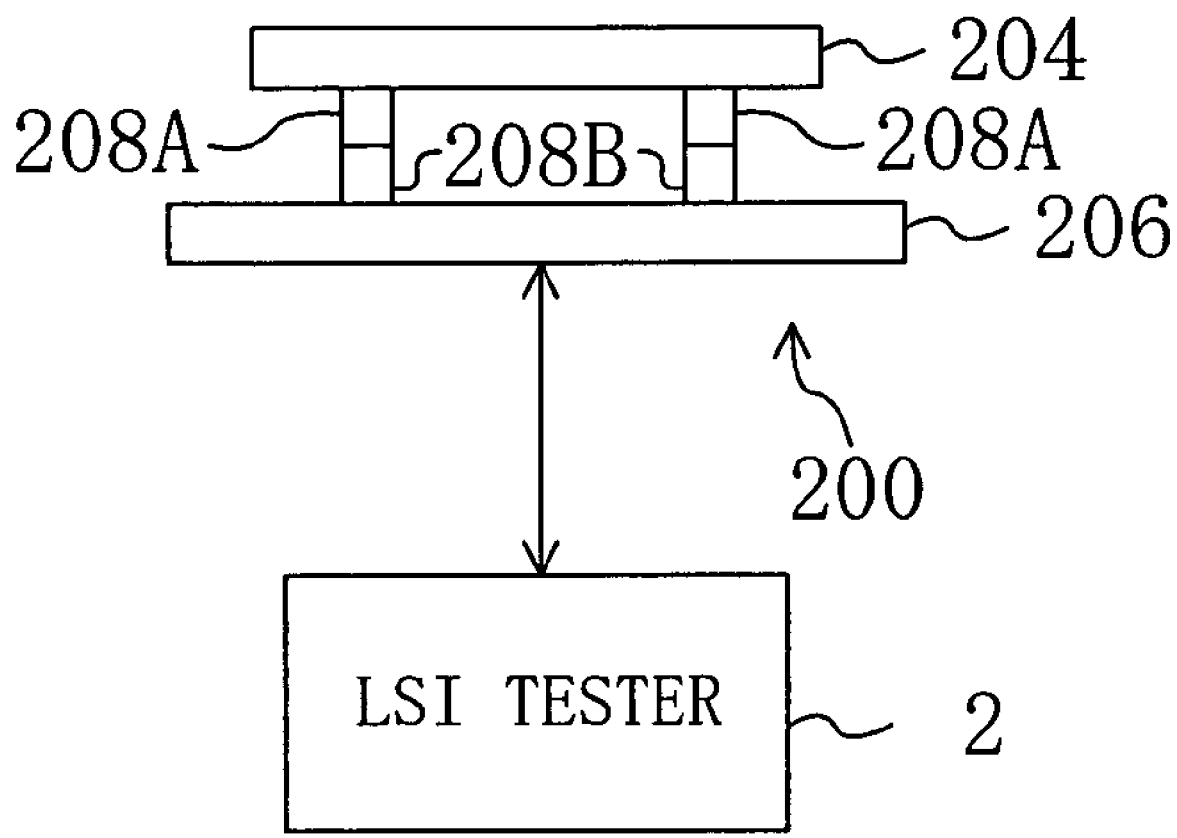
FIG. 5 is a cross-sectional view showing a load board for use in an LSI test system according to a second embodiment of the present invention.

FIG. 5 is a cross-sectional view showing a load board for use in an LSI test system according to the second embodiment. The load board 200 shown in FIG. 5 includes a first board 204 and a second board 206.

The first board 204 is the same as the load board 100 shown in FIG. 1 except that the first board 204 is provided with a connector 208A and that wiring for connecting the connector 208A and the target LSI 12 to each other is provided instead of wiring for connecting the LSI tester 2 and the target LSI 12 to each other. The first board 204 is coupled to the second board 206 via the connector 208A and a connector 208B. The second board 206 is a printed circuit board and provided with wiring for coupling the first board 204 to an LSI tester 2 via the connectors 208A and 208B. The flow of data in a test and the flow of a procedure for the test are the same as those described in the first embodiment.

In addition, the first board, for example, may be a board provided with the connector 208A and used in the actual set to which the target LSI 12 is applied, and the second board, for example, may be a general-purpose load board on which wiring has been already provided and which is broadly sold for general use by an LSI-tester fabricator. In such a case, wires necessary for the test are configured to be connected to each other between the first and second boards.

According to this embodiment, the first board 204 coupled to the target LSI 12 and equipped with a peripheral circuit thereof and the second board 206 are fabricated independently of each other, so that debugging for the boards 204 and 206 can be performed independently. Accordingly, techniques for fabricating the respective first and second boards do not necessarily combined, so that the load board can be very easily implemented. That is to say, it is sufficient that an already evaluated first board is slightly modified and a general-purpose load board sold by an LSI-tester fabricator is purchased and used as a second board so that these boards are coupled to each other.

The first board 204 normally includes a fewer number of layers than the load board 100 shown in FIG. 1. Therefore, the cost of fabricating the load board can be reduced. In the case of testing different types of LSIs, it is sufficient to replace only the first board with a board appropriated to each of the LSI.

If the board applied to the actual set is used as the first board, the cost of fabricating the load board can be further reduced. If a system for evaluating the actual set is provided, debugging can be performed by using the system, so that board debugging using the LSI tester 2 becomes almost unnecessary.

Alternatively, a plurality of first boards may be coupled to the second board. The first board and the second board may be coupled via wiring without using a connector.

Embodiment 3

In a third embodiment of the present invention, an assembly for an LSI test that reduces a cost for the test by transferring data at low speed between an LSI tester and a target LSI to be tested.

In this embodiment, the case where a target LSI 312 is tested using the load board shown in FIG. 1 will be described. The target LSI 312 has an asynchronous access function of accessing an external memory 22 asynchronously to a clock supplied to the target LSI 312. This allows an LSI tester 2 to access the external memory 22 asynchronously to the clock supplied to the target LSI 312. The load board may be provided with the first and second boards as shown in FIG. 5.

Figure 6:
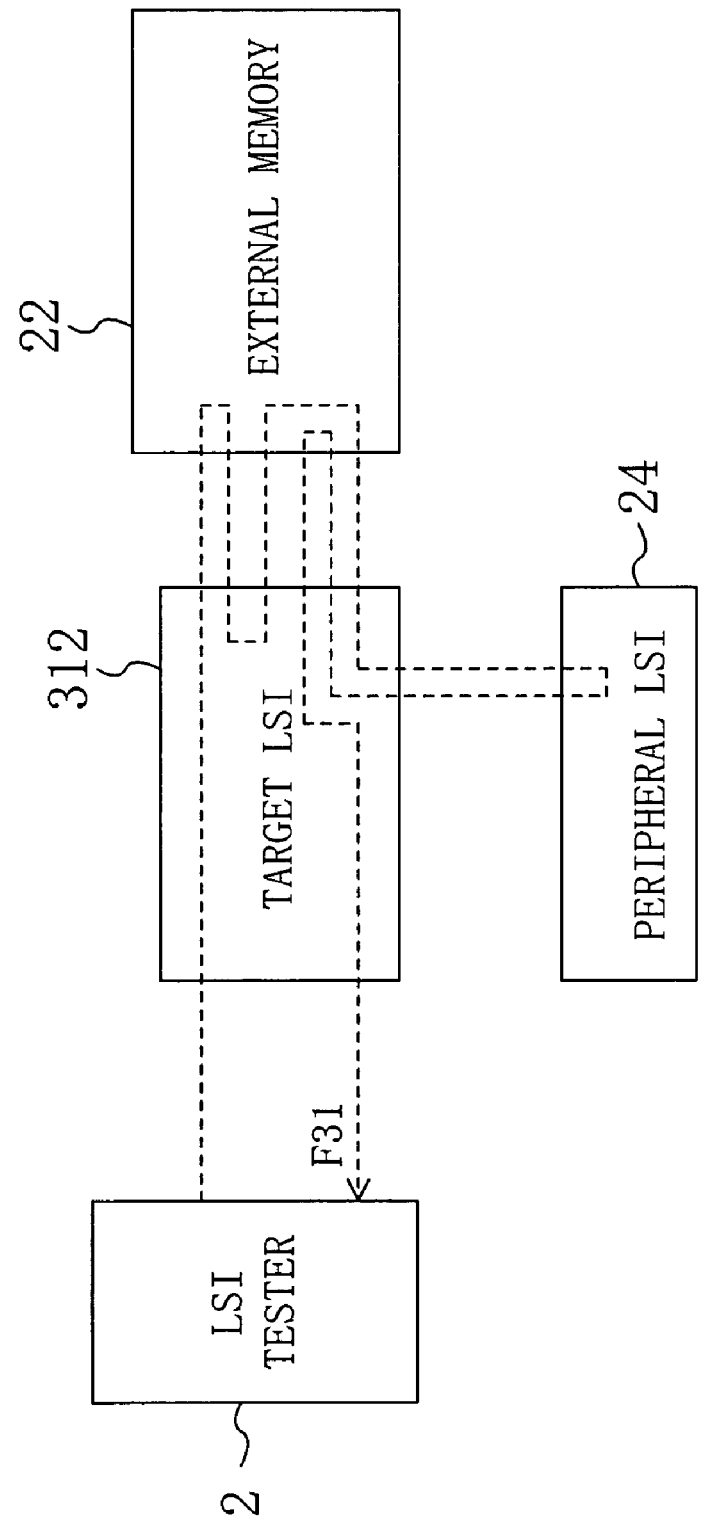
FIG. 6 is a diagram showing the flow of data in a test according to a third embodiment of the present invention.

FIG. 6 is a diagram showing the flow of data in a test according to the third embodiment. First, as indicated by a data flow F31, a test signal TS output from the LSI tester 2 is supplied to the external memory 22 by way of the target LSI 312 and stored in the external memory 22.

Next, in the same manner as in the application environment, the target LSI 312 receives the stored test signal from the external memory 22 and processes the test signal, while inputting/outputting data to/from the external memory 22 and a peripheral LSI 24. Then, the target LSI 312 outputs the obtained test result signal to the external memory 22.

The external memory 22 stores the test result signal, and then outputs the stored signal to the LSI tester 2 via the target LSI 312. The LSI tester 2 compares the test result signal TR1 with a reference test result signal that should be obtained when the target LSI 312 operates normally, thereby determining whether or not the target LSI 312 is defective in accordance with the result of the comparison.

Though FIG. 6 shows the data flow F31 in a simplified manner, input/output of data between the target LSI 312 and the external memory 22 and between the target LSI 312 and the peripheral LSI 24 is performed a plurality of times during the processing.

Figure 7:
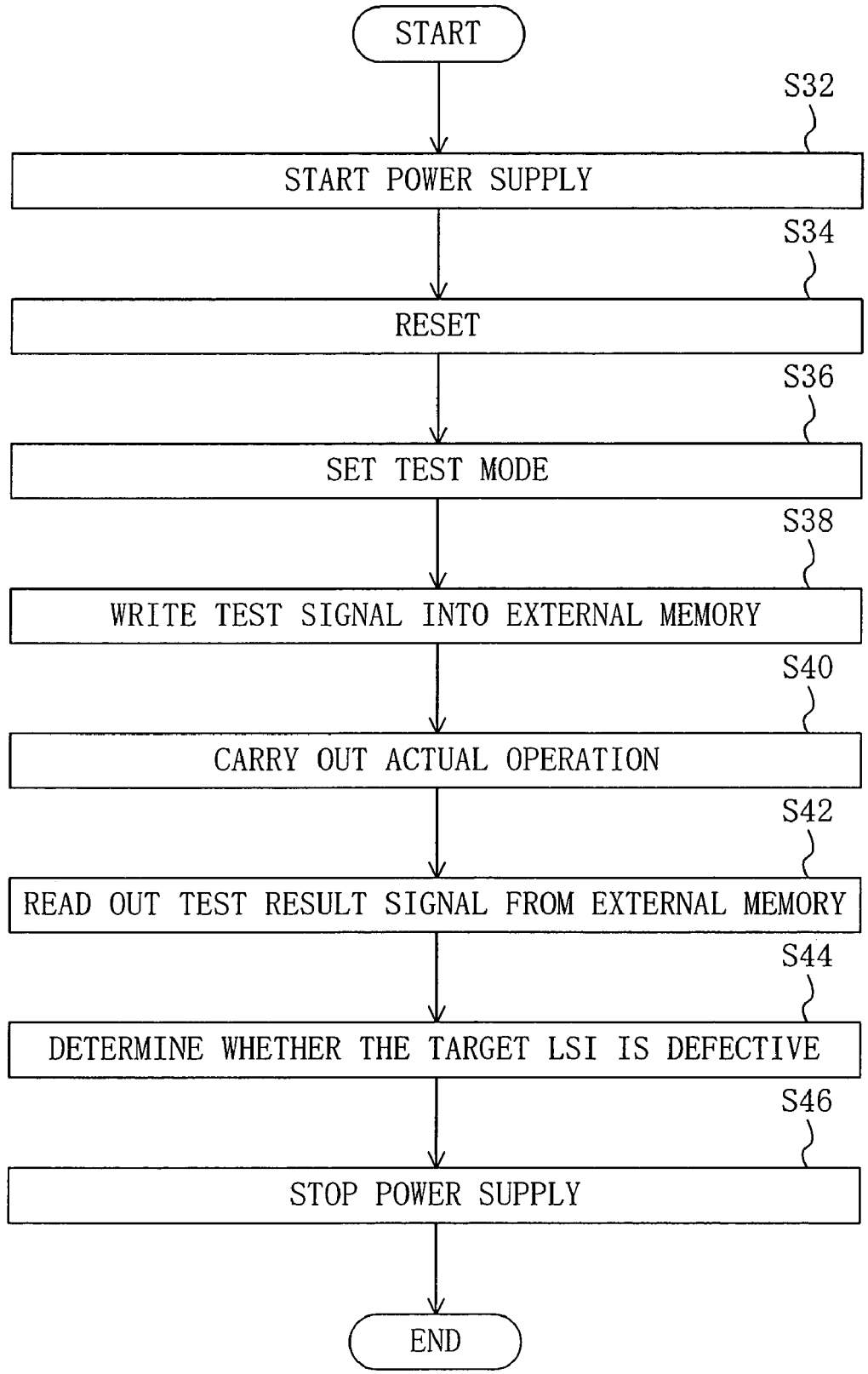
FIG. 7 is a flowchart showing a procedure of the test according to the third embodiment.

FIG. 7 is a flowchart showing a procedure of a test according to the third embodiment. The processes in steps S32, S34, S46 in FIG. 7 are the same as those in steps S12, S14 and S24 in FIG. 4, and thus description thereof is herein omitted.

In step S36, the LSI tester 2 sets the target LSI 312 in a test mode. During the test mode, the target LSI 312 reads out data for the test from the external memory 22, operates in the same manner as in the application environment, and then writes the obtained data into the external memory 22 again. The test mode is an operation mode corresponding to the actual operation and thus needs to be designed as specifications of the target LSI 312 beforehand.

In step S38, the LSI tester 2 writes a test signal into the external memory 22 using the asynchronous access function of the target LSI 312 to the external memory 22. In this case, the LSI tester 2 can access the external memory 22 asynchronously to clocks CKA, CKB and CKC, so that the LSI tester 2 does not need to synchronize with the target LSI 312 as in the case shown in FIG. 4. In general, asynchronous access can be performed at lower speed than input/output in the application environment. After the writing has completed, the target LSI 312 cancels the asynchronous access mode.

In step S40, the target LSI 312 reads out the test signal from the external memory 22, and the circuits on the load board operate in the same manner as in the application environment. The target LSI 312 writes the obtained test result signal into the external memory 22.

In step S42, the LSI tester 2 reads out the test result signal from the external memory 22 using the asynchronous access function of the target LSI 312 to the external memory 22.

In step S44, the LSI tester 2 determines whether or not the target LSI 312 is defective in accordance with the test result signal that has been read out.

In this manner, according to this embodiment, the LSI tester 2 does not need to synchronize with the target LSI 312 and the interface between the LSI tester 2 and the target LSI 312 may operate at low speed. That is to say, the LSI tester 2 does not need to have a function for synchronization and may operate at low speed, so that the cost required for the test can be reduced.

Embodiment 4

A test signal and a test result signal for an LSI tester are generated by a simulation in general. For example, the test signal and the reference test result signal used in the third embodiment have a large amount of data. Accordingly, if these signals are to be generated by a simulation, much time and high machine power are required. In view of this, in a fourth embodiment of the present invention, a system which generates a test signal and a reference test result signal for an LSI tester using an evaluation system for evaluating an actual set, and test an LSI by using the signals will be described.

Figure 8:
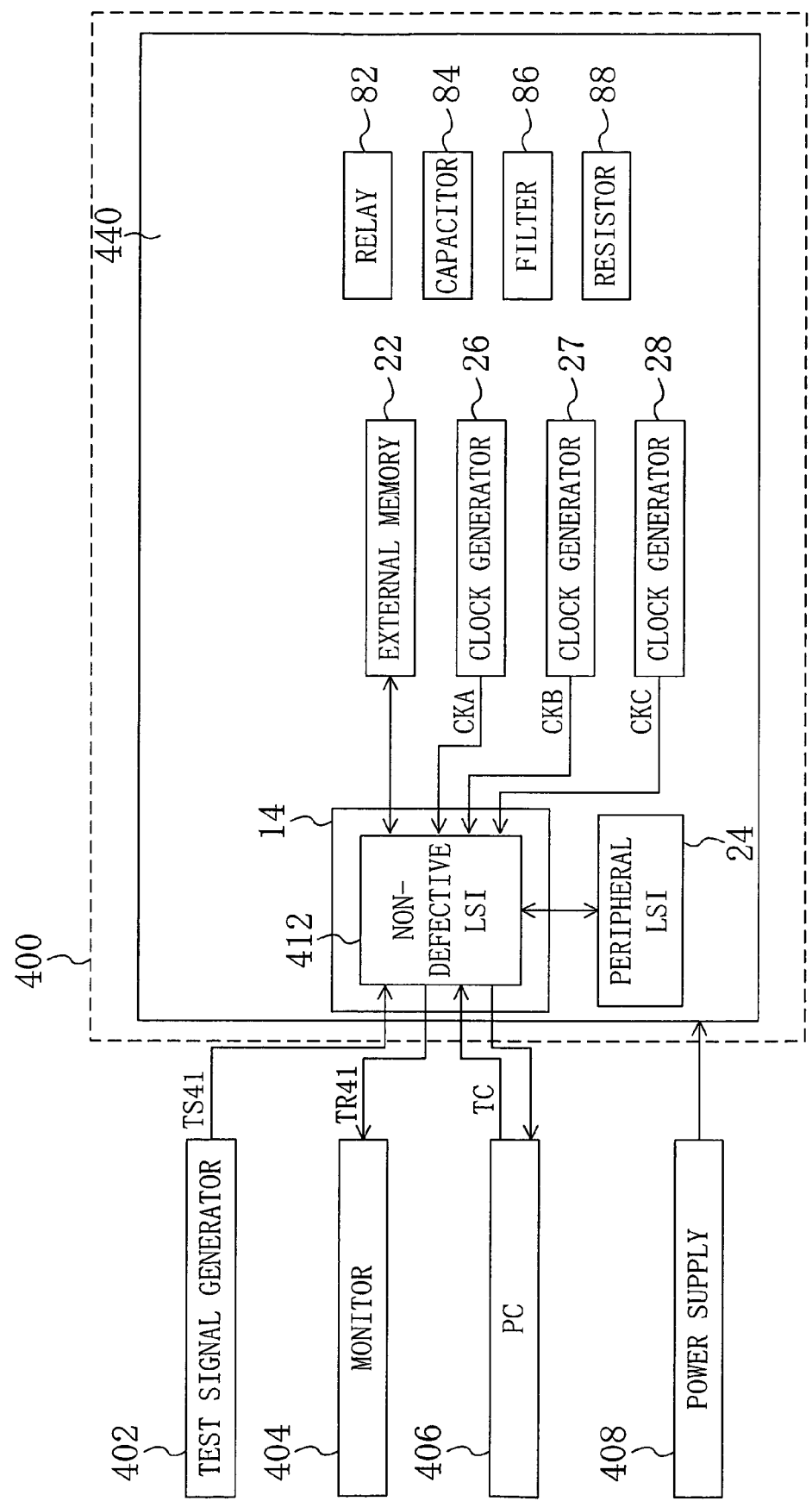
FIG. 8 is a block diagram showing a configuration of a system for generating a test signal and a reference test result signal for an LSI tester.

FIG. 8 is a block diagram showing a configuration of a system for generating a test signal and a reference test result signal for an LSI tester. The signal generating system shown in FIG. 8 includes: an actual set evaluation system board 400; a test signal generator 402; a monitor 404; a personal computer (PC) 406; and a power supply 408.

The actual set evaluation system board 400 uses a non-defective LSI 412 whose normal operation is verified and which has the same configuration as the target LSI 12, instead of the target LSI 12. Although not shown specifically, the actual set evaluation system board 400 has circuits for respectively interfacing between the non-defective LSI 412 and each of the test signal generator 402, the monitor 404 and the PC 406. The power supply 408 supplies electric power. The other components are the same as those in the load board shown in FIG. 1 except that the test result receiving circuit 30 is not provided. Therefore, detailed description of the actual set evaluation system board 400 is herein omitted.

The flow of data in generating a test signal and a reference test result signal is the same as the data flow F31 shown in FIG. 6 except that the test signal is supplied from the test signal generator 402 and that the test result signal is output from the non-defective LSI 412 to the monitor 404 or the PC 406.

Figure 9:
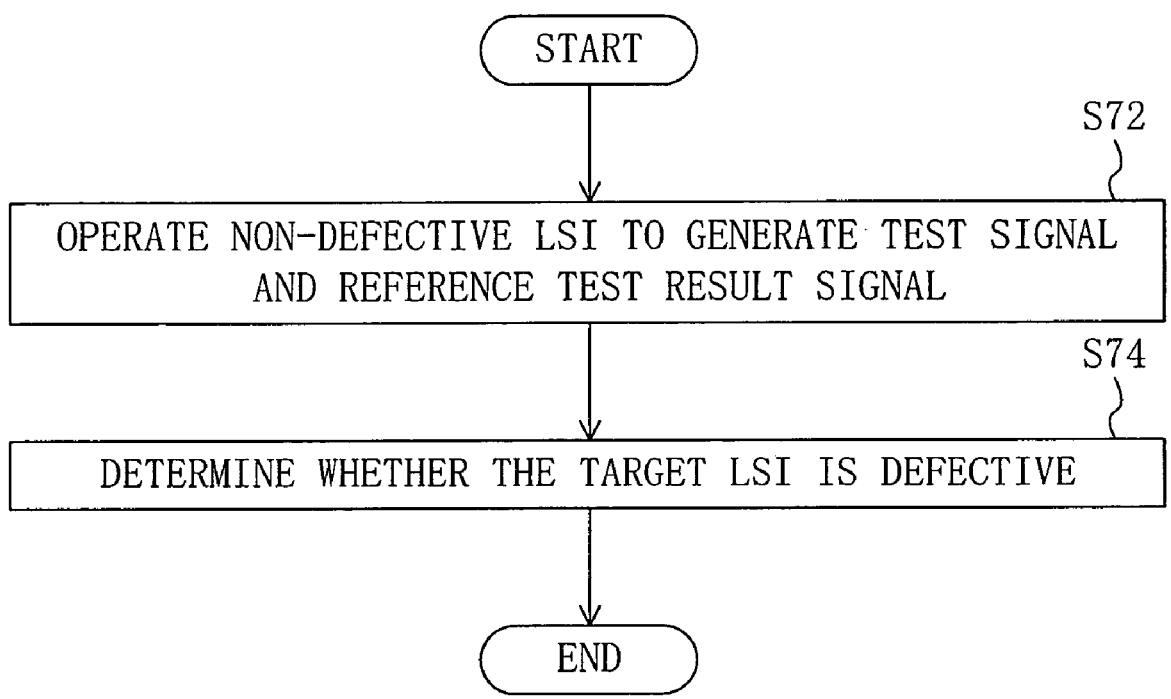
FIG. 9 is a flowchart showing a procedure in a fourth embodiment of the present invention.
Figure 10:
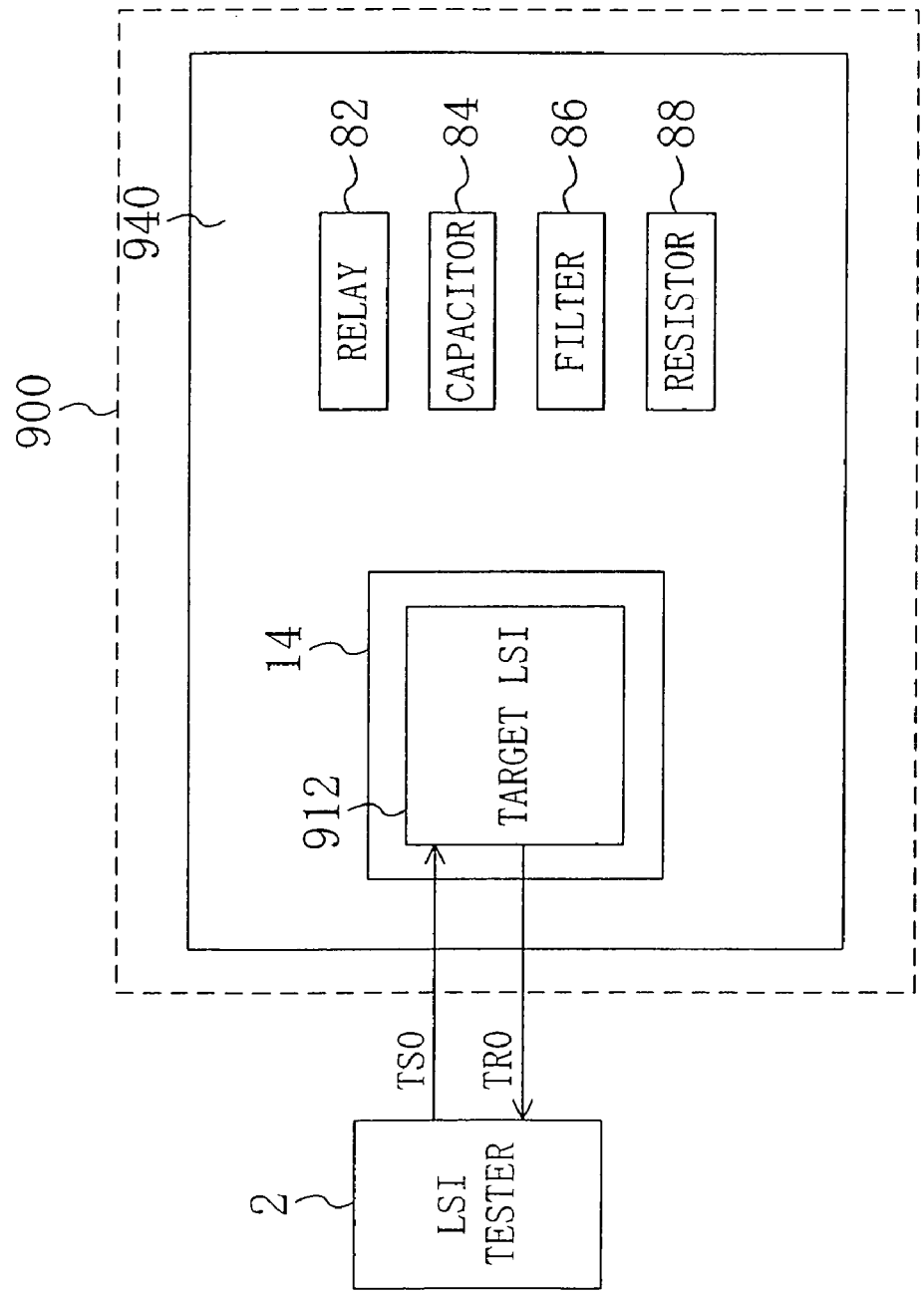
FIG. 10 is a block diagram showing an example of a configuration of a known LSI test system.

FIG. 9 is a flowchart showing a procedure in the fourth embodiment. It is hereinafter assumed that the non-defective LSI 412 performs processing based on an input test signal and output a video signal as a test result signal, for example.

Now, step S72 of generating a test signal and a reference test result signal will be described. In this step, a monitor displays an image and then the image is tested. Specifically, the supply of electric power from the power supply 408 is initiated and the non-defective LSI 412 is reset. Thereafter, the test signal generator 402 outputs a test signal TS41 to the non-defective LSI 412. The non-defective LSI 412 performs processing based on the test signal and outputs a test result signal TR41 obtained through the processing to the monitor 404, so that the monitor 404 displays an image. Then, a sensory test is conducted on the image on the monitor 404.

At this time, if the image is judged to be correct, a process of taking out the test signal to the PC 406 is performed. Specifically, the non-defective LSI 412 is reset again and is controlled by the PC 406 so as to write the same test signal as that for the image on the monitor 404 from the non-defective LSI 412 into the external memory 22. The PC 406 receives the test signal using an asynchronous access function of the non-defective LSI 412 to the external memory 22.

Thereafter, a process of taking out the test result signal as a reference test result signal to the PC 406 is performed. Specifically, the non-defective LSI 412 is reset again, and the test signal generator 402 outputs the same test signal as that for the image on the monitor 404 to the non-defective LSI 412. The non-defective LSI 412 performs processing based on the test signal. The PC 406 controls the non-defective LSI 412 and allows the test result signal obtained through the processing to be written into the external memory 22. The PC 406 receives the test result signal as a reference test result signal using the asynchronous access function of the non-defective LSI 412 to the external memory 22.

Signal patterns such as a reset pattern, a test setting pattern and an asynchronous access pattern to the external memory 22 via the target LSI are added to the test signal and the reference test result signal thus obtained, thereby generating a test signal and a reference test result signal for use in the LSI tester 2.

Next, step S74 of determining whether or not the target LSI is defective is performed. In this step, as described in the third embodiment, the target LSI is tested and determined, using the obtained test signal and reference test result signal.

In this embodiment, it takes about several tens of minutes, for example, to generate the test signal and the reference test result signal for use in the LSI tester. That is to say, the time required for generating the signals are largely reduced, as compared to the case where the signals are obtained by a simulation. In addition, the reference test result signal is generated in an environment equivalent to the test using the LSI tester. Accordingly, debugging performed with the load board coupled to the LSI tester is almost unnecessary.

The actual set evaluation system board 400 is almost the same as the first board 204 described in the second embodiment and shown in FIG. 5 expect that the circuits for interfacing between the actual set evaluation system board 400 and the PC 406, for example. Therefore, the load board 200 shown in FIG. 5 can use the actual set evaluation system board 400 instead of the first board 204. That is to say, an actual set evaluation system board can also be used to fabricate a load board, thus reducing the cost of designing the load board.

In this embodiment, the test signal and the reference test result signal used in the third embodiment are generated. However, if the signal patterns to be added to the test signal and the reference test result signal are altered, it is also possible to generate the test signals and the reference test result signals used in the first and second embodiments.

In the foregoing embodiments, the external memory is used. Alternatively, the target LSI or the peripheral LSI may include a memory which replaces the external memory.

As described above, according to the present invention, the actual operation of a system LSI with features such as high speed, asynchronous operations and multiple clocks is achieved using a general LSI tester which does not operate at high speed and is not provided with high functionality and also using a peripheral circuit which allows a target LSI to operate in the same manner as in the actual set used by a user. As a result, the test for the LSI can be performed at low cost with largely improved quality.

What is claimed is:

1. An assembly for an LSI test which supplies a test signal output from an LSI tester to a target LSI to be tested and outputs, to the LSI tester, a test result signal generated by processing of the target LSI performed in accordance with the test signal, the assembly comprising:
    a peripheral circuit coupled to the target LSI and allowing the target LSI to operate in the same manner as in actual operation;
    a first clock generator for generating a first clock as a reference clock for the actual operation in the target LSI;
    a second clock generator for generating a second clock to allow the target LSI to obtain the test signal from the LSI tester;
    a third clock generator for generating a third clock to allow the target LSI to output a test result signal, wherein the first clock, the second clock, and the third clock are asynchronous with each other; and
    a printed circuit board on which the peripheral circuit and the first, second, and third clock generators are mounted.

2. The assembly for an LSI test of claim 1, including:
    a first board including the peripheral circuit and the printed circuit board; and
    a second board coupled to the first board and including wiring for coupling the first board and the LSI tester to each other.

3. The assembly for an LSI test of claim 1, wherein the test signal is supplied to the peripheral circuit and then output from the peripheral circuit to the target LSI.

4. The assembly for an LSI test of claim 1, wherein the test result signal is supplied to the peripheral circuit and then output from the peripheral circuit to the LSI tester.

5. The assembly for an LSI test of claim 1, wherein a memory is provided as the peripheral circuit or in the target LSI, and the LSI tester is configured to be capable of accessing the memory asynchronously to a clock supplied to the target LSI.

6. The assembly for an LSI test of claim 5, wherein the test signal is stored in the memory, and then read out from the memory to be processed by the target LSI.

7. The assembly for an LSI test of claim 5, wherein the test result signal is stored in the memory, and then read out from the memory to the LSI tester.

8. An assembly for an LSI test which supplies a test signal output from an LSI tester to a target LSI to be tested and outputs, to the LSI tester, a test result signal generated by processing of the target LSI performed in accordance with the test signal, the assembly comprising:
   a test result receiving circuit for performing given processing on data obtained as the test result signal so as to reduce the amount of the data, and for outputting a result of the processing to the LSI tester;
   a first clock generator for generating a first clock as a reference clock for the actual operation in the target LSI;
   a second clock generator for generating a second clock to allow the target LSI to obtain the test signal from the LSI tester;
   a third clock generator for generating a third clock to allow the target LSI to output a test result signal, wherein the first clock, the second clock, and the third clock are asynchronous with each other; and
   a printed circuit board on which the test result receiving circuit and the first, second, and third clock generators are mounted.

9. The assembly for an LSI test of claim 8, wherein an enable control circuit for selecting necessary data from the data obtained as the test result signal and for outputting the selected data is provided in the test result receiving circuit or in the target LSI.

10. The assembly for an LSI test of claim 8, wherein the test result receiving circuit includes a compression circuit for compressing input data and outputting the compressed data.

11. The assembly for an LSI test of claim 8, wherein the test result receiving circuit includes a determination circuit for determining whether or not the input data coincides with data to be input when the target LSI operates normally, and outputting a result of the determination.

12. An LSI test system, comprising:
   an LSI tester for supplying a test signal to a target LSI to be tested; and
   an assembly for an LSI test which outputs, to the LSI tester, a test result signal generated by processing of the target LSI performed in accordance with the test signal, wherein the assembly comprises:
      a peripheral circuit coupled to the target LSI and allowing the target LSI to operate in the same manner as in actual operation;
      a first clock generator for generating a first clock as a reference clock for the actual operation in the target LSI;
      a second clock generator for generating a second clock to allow the target LSI to obtain the test signal from the LSI tester;
      a third clock generator for generating a third clock to allow the target LSI to output a test result signal, wherein the first clock, the second clock, and the third clock are asynchronous with each other; and
      a printed circuit board on which the peripheral circuit and the first, second, and third clock generators are mounted.

13. An LSI test method, comprising the steps of:
   operating a non-defective LSI, which is configured as a target LSI to be tested and has been confirmed to operate normally, in a circuit equivalent to a circuit actually used, and generating and storing a test signal and a reference test result signal, based on a signal supplied to the non-defective LSI and a signal output from the non-defective LSI, respectively, wherein the circuit comprises a first clock generator for generating a first clock as a reference clock for the actual operation in the target LSI, a second clock generator for generating a second clock to allow the target LSI to obtain the test signal, and a third clock generator for generating a third clock to allow the target LSI to output a test result signal, wherein the first clock, the second clock, and the third clock are asynchronous with each other;
   supplying the test signal to the target LSI synchronized with the second clock;
   carrying out the actual operation for the target LSI synchronized with the first clock;
   outputting the test result signal from the target LSI synchronized with the third clock; and
   determining whether or not the target LSI is defective by comparing the test result signal with the reference test result signal.

* * * * *